(12) United States Patent
Aritome et al.

(10) Patent No.: US 8,493,792 B2
(45) Date of Patent: Jul. 23, 2013

(54) PROGRAMMING METHOD OF NON-VOLATILE MEMORY DEVICE

(75) Inventors: Seiichi Aritome, Gyeonggi-do (KR); Soo Jin Wi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 45 days.

(21) Appl. No.: 13/309,760

(22) Filed: Dec. 2, 2011

(65) Prior Publication Data

US 2012/0140566 A1 Jun. 7, 2012

(30) Foreign Application Priority Data

Dec. 2, 2010 (KR) .......................... 10-2010-0122112
Dec. 1, 2011 (KR) .......................... 10-2011-0127830

(51) Int. Cl.
*G11C 16/06* (2006.01)
*G11C 11/56* (2006.01)

(52) U.S. Cl.
CPC .................................. *G11C 11/5628* (2013.01)
USPC ............ 365/185.19; 365/185.22; 365/185.24; 365/185.12; 365/236; 365/185.03

(58) Field of Classification Search
CPC .. G11C 11/5628; G11C 16/12; G11C 16/3418; G11C 16/349

USPC ................... 365/185.22, 185.12, 185.03, 236, 365/185.19

See application file for complete search history.

(56) References Cited

U.S. PATENT DOCUMENTS

2009/0129168 A1 5/2009 Kim et al.
2010/0329032 A1* 12/2010 Lim .......................... 365/185.22

* cited by examiner

*Primary Examiner* — Thong Q Le
(74) *Attorney, Agent, or Firm* — IP & T Group LLP

(57) ABSTRACT

A programming method includes setting the voltages of bit lines, performing a program operation, performing a program verify operation by supplying a program verify voltage and determining whether all of the memory cells of the selected page have been programmed with a target threshold voltage or higher, counting the number of passed memory cells corresponding to a number of pass bits, if, a result of the program verify operation, the program operation failed to program all of the memory cells of the selected page to the target threshold voltage or higher, and making a determination that determines whether the number of pass bits is greater than the first number of pass permission bits, and raising a voltage of a bit line coupled to a failed memory cell, if, as a result of the determination, the number of pass bits is greater than the first number of pass permission bits.

28 Claims, 8 Drawing Sheets

PROGRAMMING METHOD OF NON-VOLATILE MEMORY DEVICE

CROSS-REFERENCE TO RELATED APPLICATION

Priority to Korean patent application number 10-2010-0122112 filed on Dec. 2, 2010 and priority to Korean patent application number 10-2011-0127830 filed on Dec. 1, 2011, the entire disclosure of which are incorporated by reference herein, are claimed.

BACKGROUND

Exemplary embodiments relate to a programming method of a non-volatile memory device and, more particularly, to a programming method of a non-volatile memory device, that are capable of reducing the width of a threshold voltage distribution.

A non-volatile memory device that can be electrically programmed and erased and does not require a refresh function of rewriting data at specific intervals may be useful.

An incremental step pulse programming (ISPP) method is a conventional programming method for a non-volatile memory device. More specifically, a program operation is performed while a program start voltage is regularly increased per step voltage.

FIG. 1 is a flowchart illustrating the known programming method of a non-volatile memory device using the ISPP method.

Referring to FIG. 1, a program operation is performed by supplying a program voltage to a word line coupled to memory cells to be programmed at step S11.

A program verify operation is performed to check whether the memory cells have been programmed with a target threshold voltage or higher by verifying the program state of the memory cells using a page buffer coupled to the memory cell block at step S12.

If, as a result of the program verify operation, all the memory cells have been programmed with the target threshold voltage or higher, the verify operation is determined to be a pass, and the program operation is finished. If, as a result of the program verify operation, however, all the memory cells have not been programmed with the target threshold voltage or higher, the verify operation is determined to be a fail. The method continues by setting a new program voltage by raising the program voltage per a step voltage at step S13, and the process returns to step S11.

FIG. 2 shows the threshold voltage distributions of memory cells for illustrating features of the conventional programming method.

Referring to FIG. 2, in the conventional programming method, the memory cells are programmed with a target threshold voltage PV or higher in such a manner that the threshold voltage distribution of the memory cells is raised based on a new program voltage that sequentially rises from a low program start voltage.

As shown in FIG. 2, the right tail A of the threshold voltage distribution is gradually increased according to an increase in the number of program pulses supplied in the ISPP operation. The right tail A is increased because in scaled cell, amount of electron injection during program is statistically varied between cells (Program electron injection spread), then some cells have a large Vt shift by programming pulse.

If, as described above, the right tail A of the threshold voltage distribution is increased Consequently, a multi-level cell (MLC) having a plurality of threshold voltage distributions may malfunction because of a reduced threshold voltage distribution margin.

BRIEF SUMMARY

Exemplary embodiments relate to a programming method of a non-volatile memory device that are capable of reducing the threshold voltage distribution margin of memory cells. In this disclosure, after a program voltage is supplied, the number of memory cells programmed with a target threshold voltage or higher is counted. If the number of counts is greater than a set number, a bit line voltage is raised to reduce the width of a threshold voltage distribution rising according to the program voltage.

A programming method of a non-volatile memory device according to an aspect of the present disclosure includes setting voltages of bit lines coupled to a memory cell block including a plurality of pages, wherein each page of the plurality of pages includes memory cells; performing a program operation by supplying a program voltage to a word line coupled to a page selected from among the plurality of pages; performing a program verify operation by supplying a program verify voltage to the word line coupled to the selected page and determining whether all of the memory cells of the selected page have been programmed with a target threshold voltage or higher; counting a number of passed memory cells corresponding to a number of pass bits if, as a result of the program verify operation, the program operation failed to program all of the memory cells of the selected page to the target threshold voltage or higher; making a pass bits determination that determines whether the number of pass bits is greater than a first number of pass permission bits; and raising a voltage of a bit line coupled to a failed memory cell, if, as a result of the pass bits determination, the number of pass bits is greater than the first number of pass permission bits.

A programming method of a non-volatile memory device according to another aspect of the present disclosure includes setting voltages of bit lines coupled to a memory cell block including a plurality of pages, wherein each page of the plurality of pages includes memory cells; performing a program operation by supplying a program voltage to a word line coupled to a page selected from among the plurality of pages; performing first to third program verify operations by sequentially supplying first to third program verify voltages to the word line coupled to the selected page and determining whether all of the memory cells of the selected page have been programmed with a first to third target threshold voltage or higher; if, as a result of the first program verify operation, the program operation failed to program all of the memory cells of the selected page to the first target threshold voltage or higher, making a first pass bits determination that determines whether a number of first pass bits corresponding to a number of counted passed memory cells is greater than a first number of pass permission bits; if, as a result of the first pass bits determination, the number of first pass bits is greater than the first number of pass permission bits, making a second pass bits determination that determines whether the number of first pass bits is greater than a second number of pass permission bits; and if, as a result of the second pass bits determination, the number of first pass bits is equal to or less than the second number of pass permission bits, raising the voltage of the bit line, coupled to a failed memory cell, to a first bit line voltage.

A programming method of a non-volatile memory device according to yet another aspect of the present disclosure includes setting voltages of bit lines coupled to a memory cell block including a plurality of pages, wherein each page of the plurality of pages includes memory cells; performing a program operation by supplying a program voltage to a word line coupled to a page selected from among the plurality of pages; performing a program verify operation by supplying a program verify voltage to the word line coupled to the selected page and determining whether all of the memory cells of the selected page have been programmed with a first to third target threshold voltage or higher; if, as a result of the program verify operation, the program operation failed to program all of the memory cells of the selected page to the first target threshold voltage or higher, making a first determination that determines whether the program voltage is between a first program set voltage and a second program set voltage; and if, as a result of the first determination, the program voltage is between the first program set voltage and the second program set voltage, raising a voltage of a bit line coupled to a failed memory cell.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
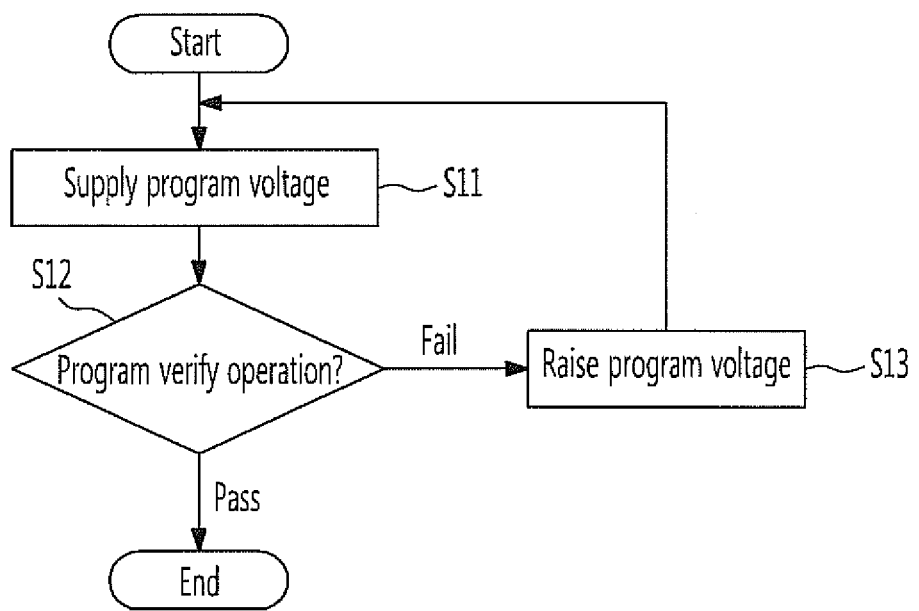
FIG. 1 is a flowchart illustrating the conventional programming method of a non-volatile memory device using a ISPP method.
Figure 2:
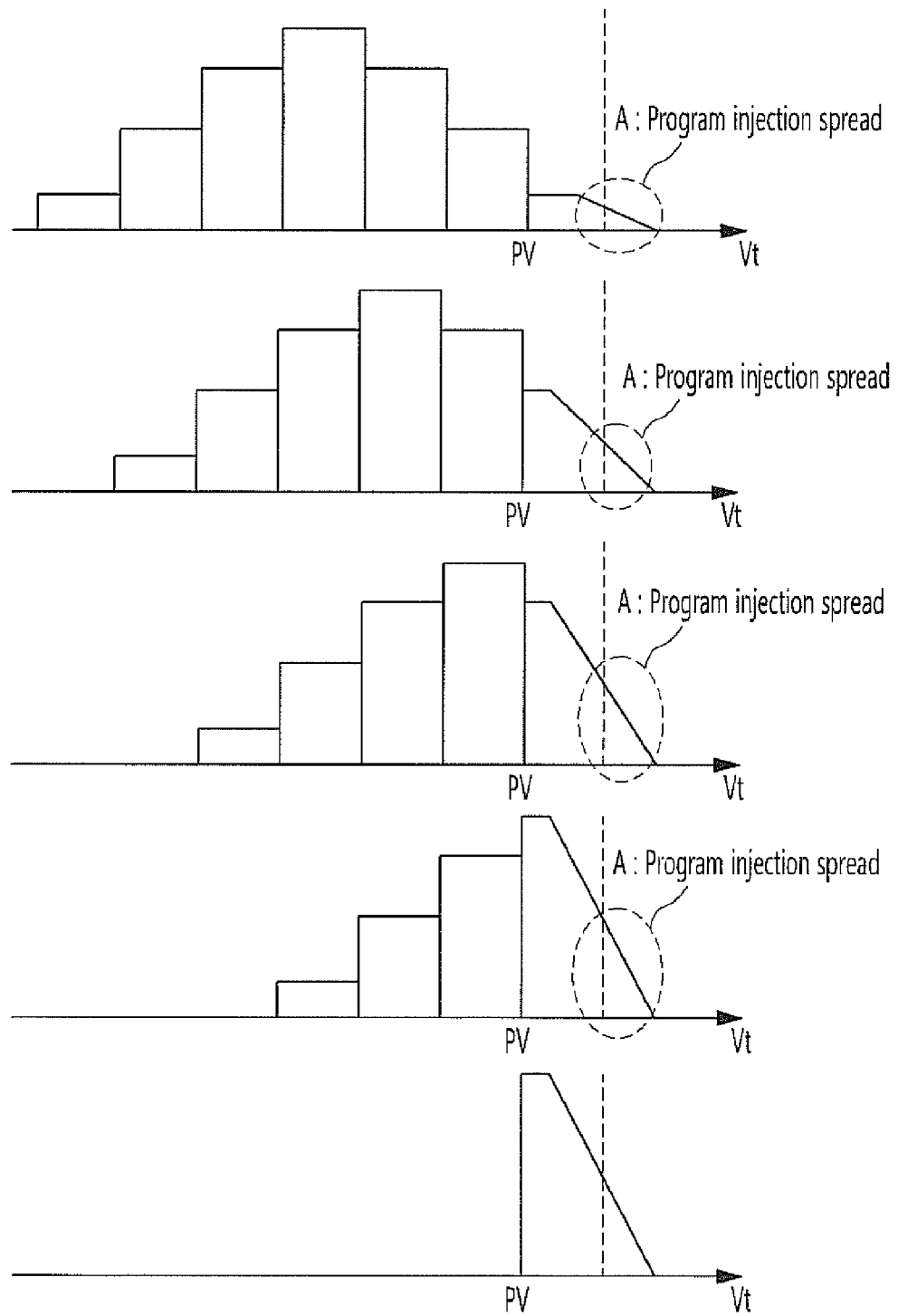
FIG. 2 shows the threshold voltage distributions of memory cells for illustrating features of the conventional programming method.
Figure 3:
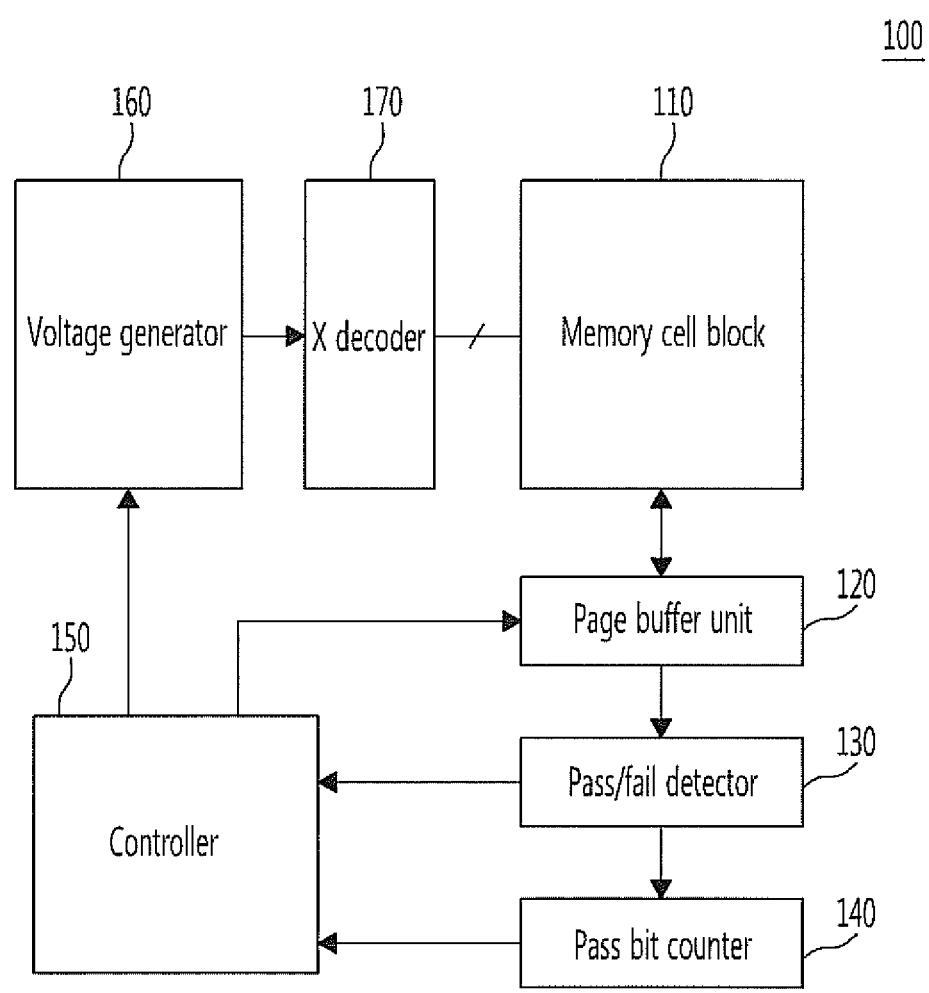
FIG. 3 shows the construction of a non-volatile memory device.

FIG. 3 shows the construction of a non-volatile memory device.

Referring to FIG. 3, the non-volatile memory device includes a memory cell block 110, a page buffer unit 120, a pass/fail detector 130, a pass bit counter 140, a controller 150, a voltage generator 160, and an X decoder 170.

The memory cell block 110 includes a plurality of memory cells for storing data or outputting stored data.

The page buffer unit 120 is coupled to the bit lines of the memory cell block 100 during a program operation. The page buffer unit 120 controls voltages of the bit lines during the program operation and determines whether memory cells have been programmed by detecting a voltage of a bit line during a program verify operation.

The pass/fail detector 130 detects whether the program operation passed or failed according to a threshold voltage state of memory cells, which is detected by the page buffer unit 120 during the program verify operation, and outputs a detection signal to the controller 150 that reports if the program verify passed or failed.

The pass bit counter 140 counts the number of passed memory cells for a program operation during the program verify operation and outputs the number of counted memory cells to the controller 150 in the form of a pass bit.

The controller 150 controls the operations of the voltage generator 160 and the page buffer unit 120 during the program operation. Furthermore, the controller 150 controls the voltage generator 160, which controls a program voltage, and the page buffer unit, which controls a bit line voltage based on the detection signal of the pass/fail detector 130 and the pass bit of the pass bit counter 140 during the program verify operation.

The voltage generator 160 generates a program voltage during the program operation. The program voltage is sequentially raised per step voltage. Furthermore, the voltage generator 160 generates verify voltages PV1, PV2, and PV3 during the program verify operation.

The X decoder outputs the program voltage to a word line, which is selected from the memory cell block 110, during the program operation and outputs the verify voltages PV1, PV2, and PV3 to the selected word line during the program verify operation.

Figure 4:
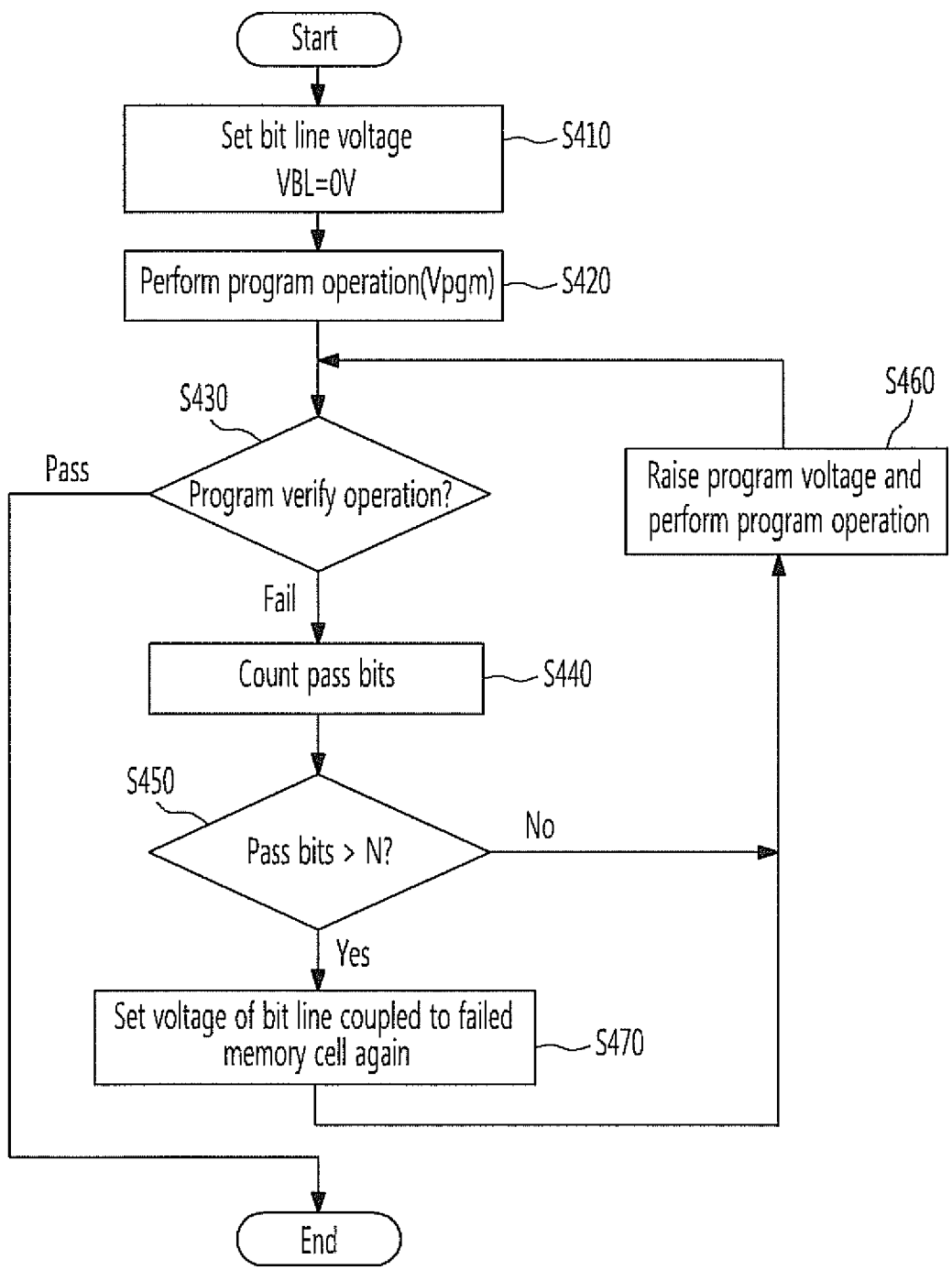
FIG. 4 is a flowchart illustrating a programming method of the non-volatile memory device according to a first embodiment of this disclosure.

FIG. 4 is a flowchart illustrating a programming method of the non-volatile memory device according to a first embodiment of this disclosure.

The programming method of the non-volatile memory device according to the first embodiment of this disclosure is described below with reference to FIGS. 3 and 4.

1) Set Voltages of Bit Lines (S410)

To perform a program operation for a page selected from the memory cell block 110, the page buffer unit 120 sets the bit line voltage VBL of the memory cell block 110. If memory cells coupled to the selected page are program cells, the bit line voltage is set to a ground voltage 0 V. If the memory cells are erase cells, the bit line voltage is set to a power source voltage VCC for program inhibition.

2) Perform Program Operation (S420)

The voltage generator 160 generates a program voltage Vpgm. The generated program voltage Vpgm is supplied to a word line, which is coupled to the selected page of the memory cell block 110, through the X decoder 170. Here, the program voltage Vpgm is a start program voltage of an ISPP method. Thus, the memory cells of the selected page are programmed while the threshold voltages of the memory cells rise.

3) Perform Program Verify Operation (S430)

Whether all the memory cells of the selected page have been programmed with a target threshold voltage or higher is determined by performing a program verify operation. If, as a result of the program verify operation, all the memory cells have been programmed with the target threshold voltage or higher, the program operation is determined to be a pass and the method ends. If one or more of the memory cells have threshold voltages lower than the target threshold voltage, the program operation is determined to be a fail.

4) Count Pass Bits (S440)

If, as a result of the program verify operation (S430), the program operation is determined to be a fail, the pass bit counter 140 counts the number of memory cells having threshold voltages equal to or higher than the target threshold voltage from the selected page. More specifically, the pass bit counter 140 counts the number of passed memory cells for the program operation, or more specifically, the number of pass bits.

5) Compare the Number of Pass Bits and the Number of Pass Permission Bits (S450)

Whether the number of pass bits counted by the pass bit counter 140 is greater than the number of pass permission bits N is determined in step S450. According to an example, the number of pass permission bits N is set to 1% or lower of the total bits of the selected page. For example, a memory cell block having one page of 8 KB, the number of pass permission bits N is 80 bytes (more specifically, 640 bits or lower).

6) Raise Program Voltage and Perform Program Operation (S460)

If, as a result of the comparison (S450), the number of pass bits is equal to or less than the number of pass permission bits N, the program voltage is raised, and the program operation is performed using the raised program voltage. According to an example, the raised program voltage is to be raised per a step voltage Vstep as compared with the previous program voltage. Next, the process returns to step S430 where the program verify operation is performed again.

7) Set Voltage of Bit Line Coupled to Failed Memory Cell Again (S470)

If, as a result of the comparison (S450), the number of pass bits is greater than the number of pass permission bits N, a voltage of a bit line coupled to a failed memory cell is set to a new voltage higher than the ground voltage again. According to an example, the new bit line voltage is higher than the first bit line voltage per 'a x step voltage Vstep', but lower than the power source voltage VCC supplied for program inhibition. Here, 'a' has a value between 0 and 1. A step voltage used to raise a program voltage in the ISPP method is used as the step voltage Vstep. Next, the process returns to step S460 where the program voltage is raised and the program verify operation is performed again.

According to the first embodiment of this disclosure, if a program verify operation is determined to be a fail, the number of pass bits is counted. If the number of counted pass bits is greater than the number of pass permission bits N, a voltage of a bit line coupled to a failed memory cell is raised higher than a previous bit line voltage, and a programming method using the ISPP method is performed. Accordingly, a threshold voltage rising per program pulse is reduced, and thus the width of a threshold voltage distribution is reduced as compared with the conventional art. In this embodiment, the width of the threshold voltage distribution is reduced because a step voltage is reduced in the ISPP method and the time taken to perform a program operation is not increased.

Figure 5:
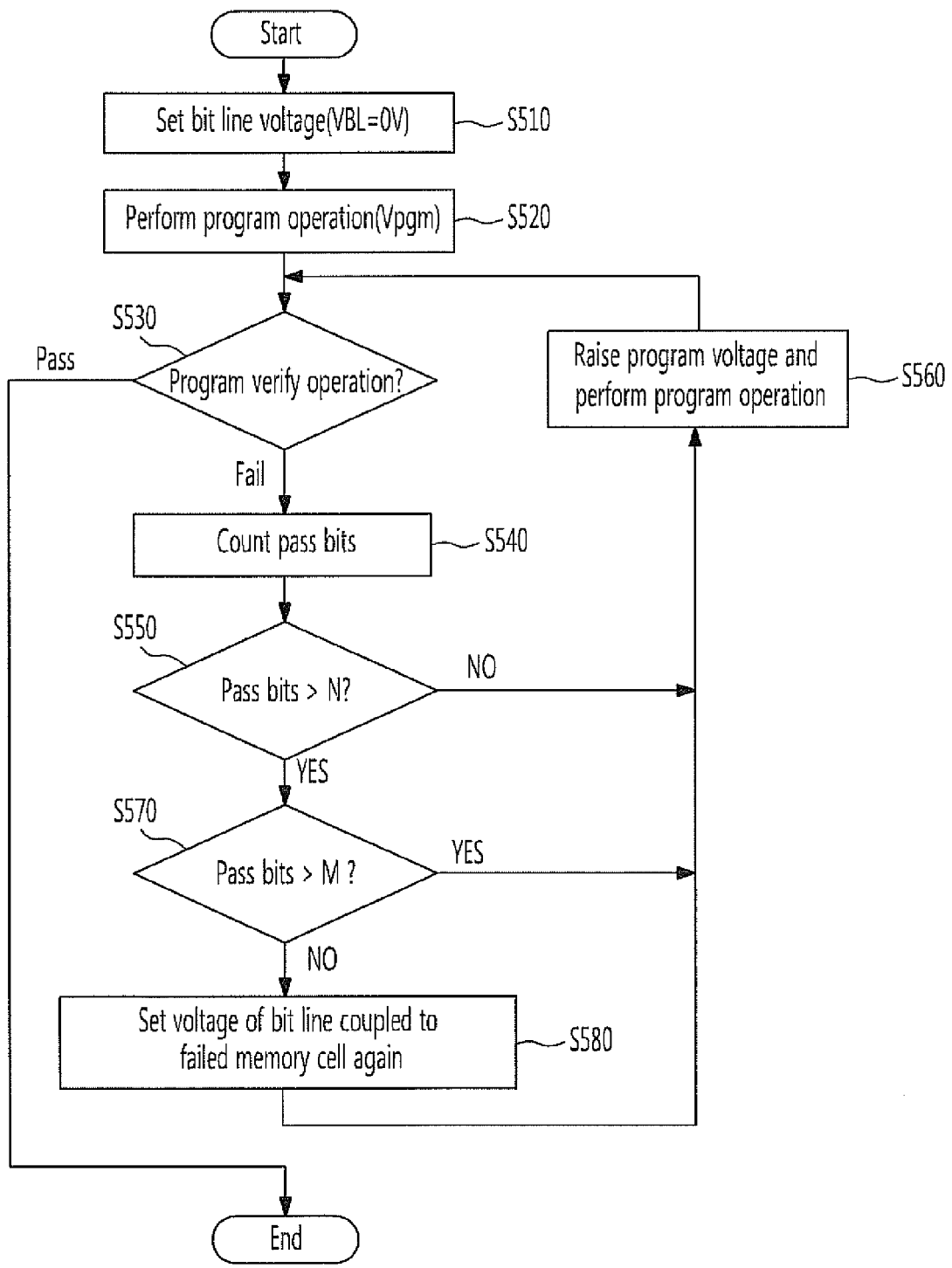
FIG. 5 is a flowchart illustrating a programming method of the non-volatile memory device according to a second embodiment of this disclosure.

FIG. 5 is a flowchart illustrating a programming method of the non-volatile memory device according to a second embodiment of this disclosure.

The programming method of the non-volatile memory device according to the second embodiment of this disclosure is described below with reference to FIGS. 3 and 5.

1) Set Voltages of Bit Lines (S510)

To perform a program operation for a page selected from the memory cell block 110, the page buffer unit 120 sets the bit line voltage VBL of the memory cell block 110. If memory cells coupled to the selected page are program cells, the bit line voltage is set to a ground voltage 0 V. If the memory cells are erase cells, the bit line voltage is set to a power source voltage VCC for program inhibition.

2) Perform Program Operation (S520)

The voltage generator 160 generates a program voltage Vpgm. The generated program voltage Vpgm is supplied to a word line, which is coupled to the selected page of the memory cell block 110, through the X decoder 170. Here, the program voltage Vpgm is a start program voltage of an ISPP method. Thus, the memory cells of the selected page are programmed while the threshold voltages of the memory cells rise.

3) Perform Program Verify Operation (S530)

Whether all the memory cells of the selected page have been programmed with the target threshold voltage or higher is determined by performing a program verify operation. If, as a result of the program verify operation, all the memory cells have been programmed with the target threshold voltage or higher, the program operation is determined to be a pass and the method ends. If one or more of the memory cells have threshold voltages lower than the target threshold voltage, the program operation is determined to be a fail.

4) Count Pass Bits (S540)

If, as a result of the program verify operation (S530), the program operation is determined to be a fail, the pass bit counter 140 counts the number of memory cells having threshold voltages equal to or higher than the target threshold voltage from the selected page. More specifically, the pass bit counter 140 counts the number of passed memory cells for the program operation, or more specifically, the number of pass bits.

5) Compare the Number of Pass Bits and the Number of Pass Permission Bits (S550)

Whether the number of pass bits counted by the pass bit counter 140 is greater than the first number of pass permission bits N is determined in step S550. According to an example, the first number of pass permission bits N is set to 1% or lower of the total bits of the selected page. For example, in a memory cell block having one page of 8 KB, the first number of pass permission bits N is 80 bytes (more specifically, 640 bits or lower).

6) Raise Program Voltage and Perform Program Operation (S560)

If, as a result of the comparison (S550), the number of pass bits is equal to or less than the first number of pass permission bits N, the program voltage is raised and the program operation is performed using the raised program voltage. According to an example, the raised program voltage is raised per a step voltage Vstep as compared with the previous program voltage. Next, the process returns to step S530 where the program verify operation is performed again.

7) Compare the Number of Pass Bits with the Second Number of Pass Permission Bits (S570)

If, as a result of the comparison (S550), the number of pass bits is greater than the first number of pass permission bits N, whether the number of pass bits is greater than the second number of pass permission bits M is determined. According to an example, the second number of pass permission bits M is set to 99% or higher of the total bits of the selected page. For example, in a memory cell block having one page of 8 KB, the second number of pass permission bits M is 7.92 KB (more specifically, 64880 bits or higher). If, as a result of the comparison (S570), the number of pass bits is greater than the second number of pass permission bits M, the process returns to step S560 where the program voltage is raised and the program operation is performed again.

8) Set Voltage of Bit Line Coupled to Failed Memory Cell Again (S580)

If, as a result of the comparison (S570), the number of pass bits is greater than the second number of pass permission bits M, a voltage of a bit line coupled to a failed memory cell is set to a new voltage higher than the ground voltage again. According to an example, the new bit line voltage is higher than the first bit line voltage per 'a x step voltage Vstep', but lower than the power source voltage VCC supplied for program inhibition. Here, 'a' has a value between 0 and 1. A step voltage used to raise a program voltage in the ISPP method is used as the step voltage Vstep. Next, the process returns to step S560 where the program voltage is raised and the program verify operation is performed again.

According to the second embodiment of this disclosure, if a program verify operation is determined to be a fail, the number of pass bits is counted. If the number of counted pass bits is between the first number of pass permission bits N and the second number of pass permission bits M, a voltage of a bit line coupled to a failed memory cell is raised higher than a previous bit line voltage, and a programming method using the ISPP method is performed. Accordingly, a threshold voltage rising per program pulse is reduced, and thus the width of a threshold voltage distribution is reduced as compared with the conventional art. In this embodiment, the width of the threshold voltage distribution is reduced because a step voltage is reduced in the ISPP method and the time taken to perform a program operation is not increased.

Figure 6:
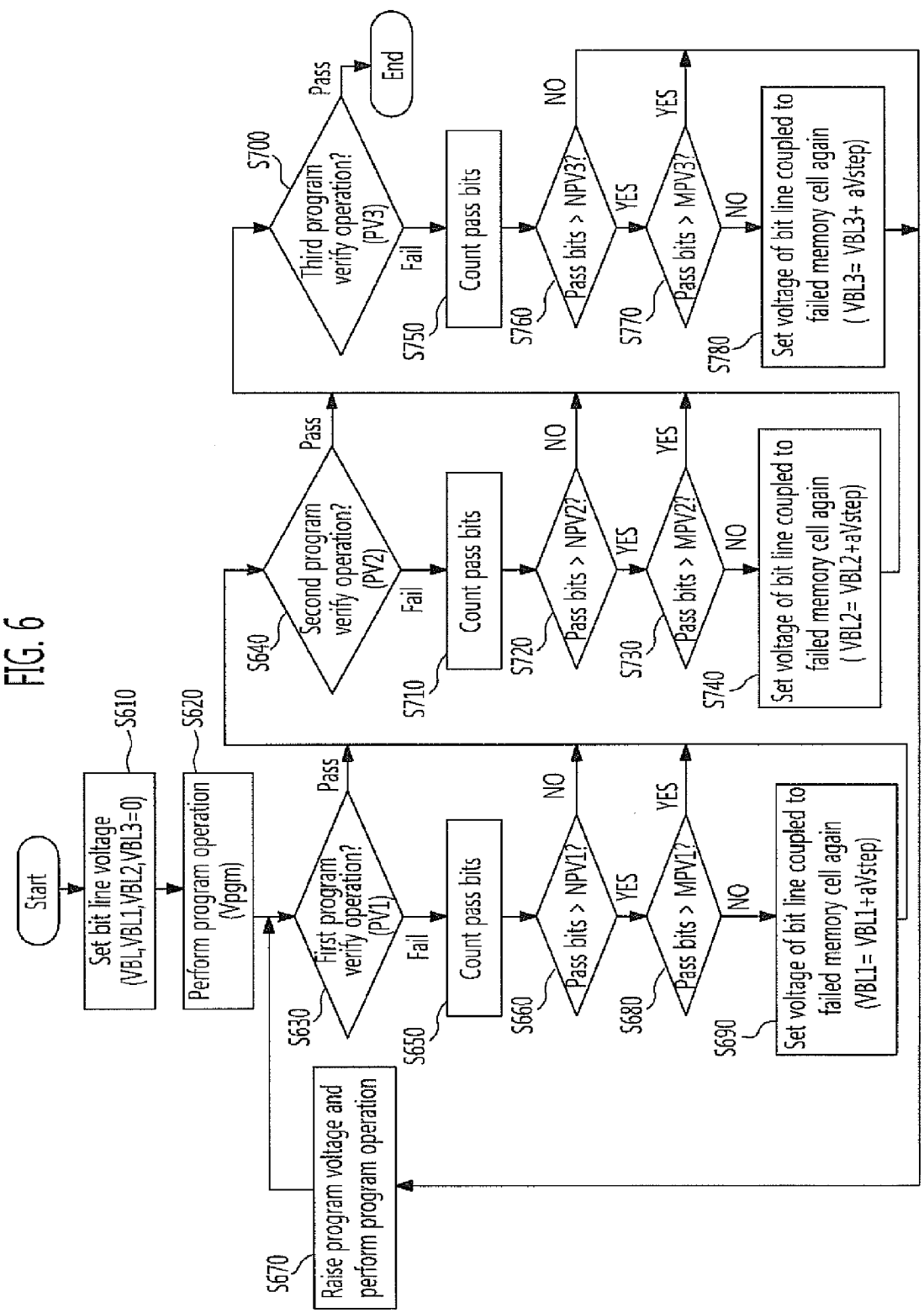
FIG. 6 is a flowchart illustrating a programming method of the non-volatile memory device according to a third embodiment of this disclosure.

FIG. 6 is a flowchart illustrating a programming method of the non-volatile memory device according to a third embodiment of this disclosure. The third embodiment is an embodiment related to a programming method of an MLC capable of storing data of 2 bits.

Figure 7:
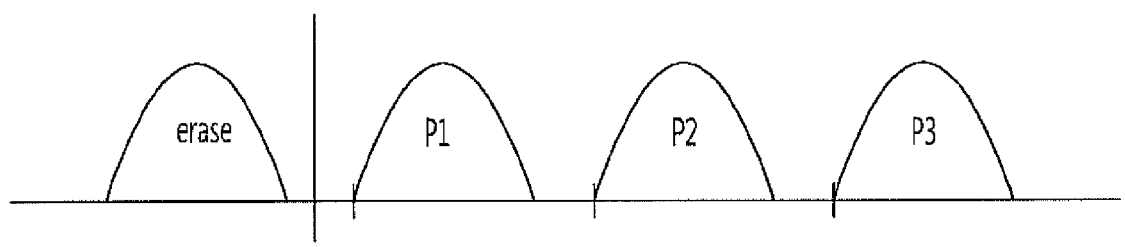
FIG. 7 shows the threshold voltage distributions of memory cells for illustrating the programming method of FIG. 6.

FIG. 7 shows the threshold voltage distributions of memory cells for illustrating the programming method of FIG. 6.

The programming method of the non-volatile memory device according to the third embodiment of this disclosure is described below with reference to FIGS. 3, 6, and 7.

1) Set Voltages of Bit Lines (S610)

To perform a program operation for a page selected from the memory cell block 110, the page buffer unit 120 sets the initial bit line voltage VBL of the memory cell block 110. If memory cells coupled to the selected page are program cells, the initial bit line voltage VBL is set to a ground voltage 0 V. And a first bit line voltage VBL1, a second bit line voltage VBL2 and a third bit line voltage VBL3 are set to a ground voltage 0 V. If the memory cells are erase cells, the bit line voltage is set to a power source voltage VCC for program inhibition.

2) Perform Program Operation (S620)

The voltage generator 160 generates a program voltage Vpgm. The generated program voltage Vpgm is supplied to a word line, which is coupled to the selected page of the memory cell block 110, through the X decoder 170. Here, the program voltage Vpgm is a start program voltage of an ISPP method. Thus, the memory cells of the selected page are programmed while the threshold voltages of the memory cells rise.

3) Perform First Verify Operation (S630)

Whether all the memory cells of the selected pages have been programmed with the first threshold voltage PV1 or higher is determined by performing a first verify operation. If, as a result of the first verify operation, all the memory cells are determined to have been programmed with the first threshold voltage PV1 or higher, the program operation is determined to be a pass. If one or more of the memory cells are determined to have threshold voltages lower than the first threshold voltage, the program operation is determined to be a fail.

4) Perform Second Verify Operation (S640)

If, as a result of the first verify operation (S630), the program operation is determined to be a pass, whether all the memory cells of the selected page have been programmed with a second threshold voltage PV2 or higher is determined by performing a second verify operation. If, as a result of the second verify operation, all the memory cells are determined to have been programmed with the second threshold voltage PV2 or higher, the program operation is determined to be a pass. If one or more of the memory cells are determined to have threshold voltages lower than the second threshold voltage, the program operation is determined to be a fail.

5) Count the Number of Pass Bits (S650)

If, as a result of the first verify operation (S630), the program operation is determined to be a fail, the pass bit counter 140 counts the number of memory cells having threshold voltages equal to or higher than the first threshold voltage from the selected page. More specifically, the number of passed memory cells for the program operation, or more specifically, the number of pass bits.

6) Compare the Number of Pass Bits with the First Number of Pass Permission Bits (S660)

Whether the number of pass bits counted by the pass bit counter 140 is greater than the first number of pass permission bits NPV1 is determined in step S660. According to an example, the first number of pass permission bits NPV1 is set to higher than 10 bits and the first number of pass permission bits NPV1 is set to 20% or lower of the total bits of the selected page. (10 bits<NPV1<20% of the total bits) If, as a result of the comparison (S660), the number of pass bits is equal to or less than the first number of pass permission bits NPV1, the second verify operation (S640) is performed.

7) Compare the Number of Pass Bits with the Second Number of Pass Permission Bits (S680)

If, as a result of the comparison (S660), the number of pass bits is greater than the first number of pass permission bits NPV1, whether the number of pass bits is greater than the second number of pass permission bits MPV1 is determined. According to an example, the second number of pass permission bits MPV3 is set to 80% or higher of the total bits of the selected page, and the second number of pass permission bits MPV1 is set to lower of 10 bits less than the total bits of the selected page. (80% of the total bits<MPV1<the total bits−10 bits) If, as a result of the comparison (S680), the number of pass bits is greater than the second number of pass permission bits MPV1, the second verify operation (S640) is performed.

8) Set Voltage of Bit Line Coupled to Failed Memory Cell Again (S690)

If, as a result of the comparison (S680), the number of pass bits is equal to or less than the second number of pass permission bits MPV1, a voltage of a bit line coupled to a failed memory cell is set to a first bit line voltage VBL1 higher than the ground voltage. According to an example, the first bit line voltage VBL1 is higher than the existing first bit line voltage per 'a x step voltage Vstep', but lower than the power source voltage supplied for program inhibition. Here, 'a' has a value between 0 and 1. A step voltage used to raise a program voltage in the ISPP method is used as the step voltage Vstep. Next, the second verify operation (S640) is performed.

9) Perform Third Verify Operation (S700)

If, as a result of the second verify operation (S640), the program operation is determined to be a pass, whether all the memory cells of the selected page have been programmed with a third threshold voltage PV3 or higher is determined by performing a third verify operation. If, as a result of the third verify operation all the memory cells are programmed with the third threshold voltage PV3 or higher, the program operation is determined to be a pass. If one or more of the memory cells have threshold voltages lower than the third threshold voltage, the program operation is determined to be a fail.

10) Count the Number of Pass Bits (S710)

If, as a result of the second program verify operation (S640), the program operation is determined to be a fail, the pass bit counter 140 counts the number of memory cells having threshold voltages equal to or higher than the second threshold voltage PV2 from the selected page. More specifically, the pass bit counter 140 counts the number of passed memory cells for the program operation, or more specifically, the number of pass bits.

11) Compare the Number of Pass Bits and the First Number of Pass Permission Bits (S720)

Whether the number of pass bits counted by the pass bit counter 140 is greater than the first number of pass permission bits NPV2 is determined in step S720. According to an example, the first number of pass permission bits NPV2 is set to higher than 10 bits and the first number of pass permission bits NPV2 is set to 20% or lower of the total bits of the selected page. (10 bits<NPV2<20% of the total bits) If, as a result of the comparison (S720), the number of pass bits is equal to or less than the first number of pass permission bits NPV2, the third verify operation (S700) is performed.

12) Compare the Number of Pass Bits with the Second Number of Pass Permission Bits (S730)

If, as a result of the comparison (S720), the number of pass bits is greater than the first number of pass permission bits NPV2, whether the number of pass bits is greater than the second number of pass permission bits MPV2 is determined. According to an example, the second number of pass permission bits MPV2 is set to 80% or higher of the total bits of the selected page, and the second number of pass permission bits MPV2 is set to lower of 10 bits less than the total bits of the selected page. (80% of the total bits<MPV2<the total bits−10 bits) If, as a result of the comparison (S730), the number of pass bits is greater than the second number of pass permission bits MPV2, the third verify operation (S700) is performed.

13) Set Voltage of Bit Line Coupled to Failed Memory Cell Again (S740)

If, as a result of the comparison (S730), the number of pass bits is equal to or less than the second number of pass permission bits MPV2, a voltage of a bit line coupled to a failed memory cell is set to a second bit line voltage VBL2 higher than the ground voltage. According to an example, the second bit line voltage VBL2 is higher than the existing second bit line voltage VBL2 per 'a x step voltage Vstep', but lower than the power source voltage supplied for program inhibition. Here, 'a' has a value between 0 and 1. A step voltage used to raise a program voltage in the ISPP method is used as the step voltage Vstep. Next, the third verify operation (S700) is performed.

14) Count Pass Bits (S750)

If, as a result of the third program verify operation (S700), the program operation is determined to be a fail, the pass bit counter 140 counts the number of memory cells having threshold voltages equal to or higher than the third threshold voltage PV3 from the selected page. More specifically, the pass bit counter 140 counts the number of passed memory cells for the program operation, or more specifically, the number of pass bits.

15) Compare the Number of Pass Bits and the First Number of Pass Permission Bits (S760)

Whether the number of pass bits counted by the pass bit counter 140 is greater than the first number of pass permission bits NPV3 is determined in step S760. According to an example, the first number of pass permission bits NPV3 is set to higher than 10 bits and the first number of pass permission bits N is set to 20% or lower of the total bits of the selected page. (10 bits<NPV3<20% of the total bits)

16) Raise Program Voltage and Perform Program Operation (S670)

If, as a result of the comparison (S760), the number of pass bits is equal to or less than the first number of pass permission bits N, the program voltage is raised and the program operation is performed using the raised program voltage. According to an example, the raised program voltage is raised per a step voltage Vstep as compared with the previous program voltage. Next, the process returns to step S630 where the program verify operation is performed again.

17) Compare the Number of Pass Bits with the Second Number of Pass Permission Bits (S770)

If, as a result of the comparison (S760), the number of pass bits is greater than the first number of pass permission bits NPV3, whether the number of pass bits is greater than the second number of pass permission bits MPV3 is determined. According to an example, the second number of pass permission bits MPV3 is set to 80% or higher of the total bits of the selected page, and the second number of pass permission bits MPV3 is set to lower of 10 bits less than the total bits of the selected page. (80% of the total bits<MPV3<the total bits−10 bits) If, as a result of the comparison (S770), the number of pass bits is greater than the second number of pass permission bits M, the process returns to step S670 where the program voltage is raised and the program operation is performed again.

18) Set Voltage of Bit Line Coupled to Failed Memory Cell Again (S780)

If, as a result of the comparison (S770), the number of pass bits is equal to or less than the second number of pass permission bits MPV3, a voltage of a bit line coupled to a failed memory cell is set to a third bit line voltage VBL3 higher than the ground voltage. According to an example, the third bit line voltage VBL3 is higher than the existing third bit line voltage VBL3 per 'a x step voltage Vstep', but lower than the power source voltage supplied for program inhibition. Here, 'a' has a value between 0 and 1. The step voltage used to raise the program voltage in the ISPP method is used as the step voltage Vstep. Next, the process returns to step S670 where the program verify voltage is raised and the program operation is performed again.

According to the third embodiment of this disclosure, if a program verify operation is determined to be a fail, the number of pass bits is counted. If the number of counted pass bits is between the first number of pass permission bits N and the second number of pass permission bits M, a voltage of a bit line coupled to a failed memory cell is raised higher than a previous bit line voltage, and a programming method using the ISPP method is performed. Accordingly, a threshold voltage rising per program pulse is reduced, and thus the width of a threshold voltage distribution is reduced as compared with the conventional art. In this embodiment, the width of the threshold voltage distribution is reduced because a step voltage is reduced in the ISPP method and the time taken to perform a program operation is not increased.

Figure 8:
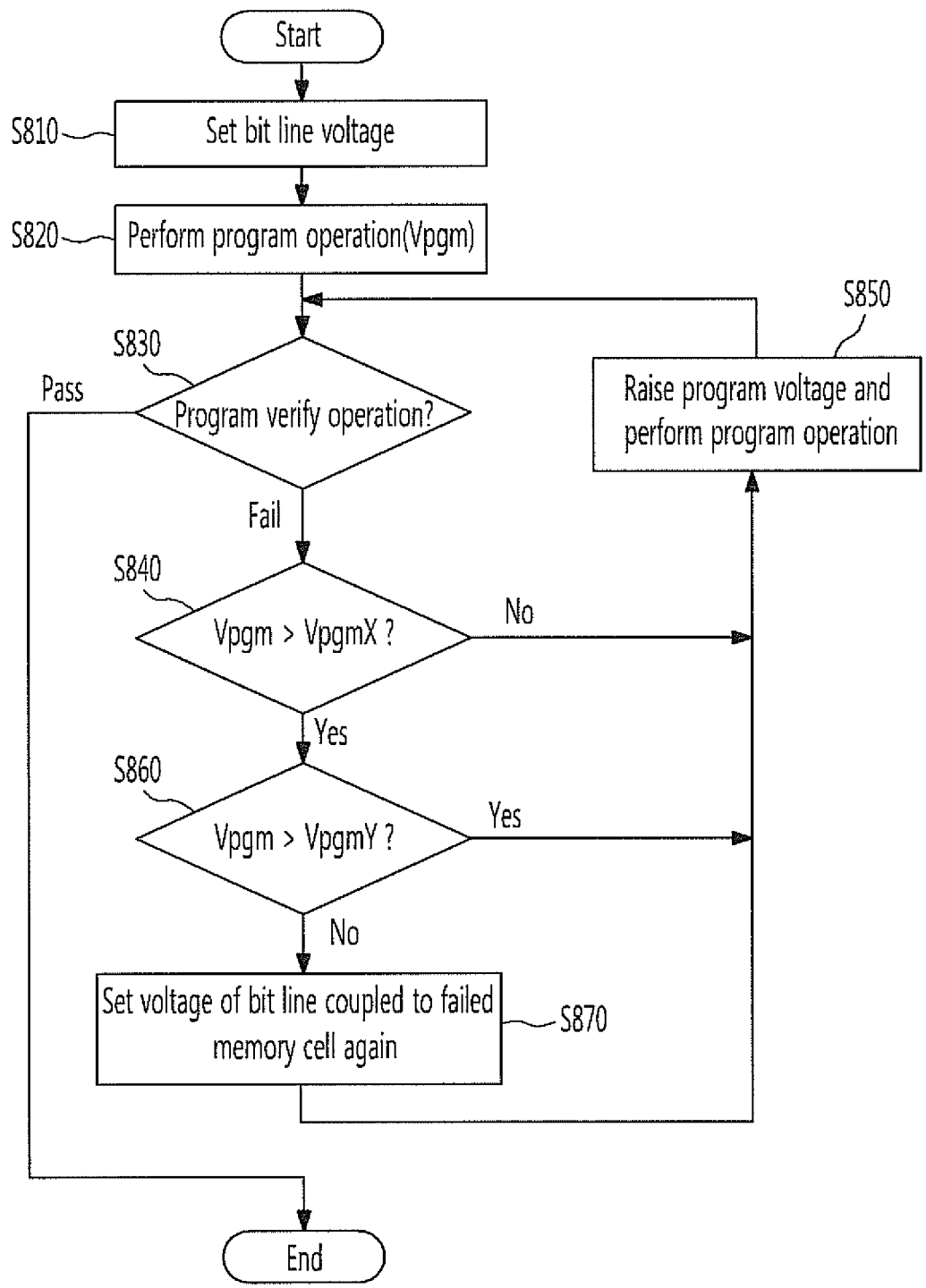
FIG. 8 is a flowchart illustrating a programming method of the non-volatile memory device according to a fourth embodiment of this disclosure.

FIG. 7 shows the threshold voltage distributions of memory cells for illustrating the programming method of FIG. 6. FIG. 8 is a flowchart illustrating a programming method of the non-volatile memory device according to a fourth embodiment of this disclosure.

The programming method of the non-volatile memory device according to the fourth embodiment of this disclosure is described below with reference to FIGS. 3 and 8.

1) Set Voltages of Bit Lines (S810)

To perform a program operation for a page selected from the memory cell block 110, the page buffer unit 120 sets the bit line voltage VBL of the memory cell block 110. If memory cells coupled to the selected page are program cells, the bit line voltage is set to a ground voltage 0 V. If the memory cells are erase cells, the bit line voltage is set to a power source voltage VCC for program inhibition.

2) Perform Program Operation (S820)

The voltage generator 160 generates a program voltage Vpgm. The generated program voltage Vpgm is supplied to a word line, which is coupled to the selected page of the memory cell block 110, through the X decoder 170. Here, the program voltage Vpgm is a start program voltage of an ISPP method. Thus, the memory cells of the selected page are programmed while the threshold voltages of the memory cells rise.

3) Perform Program Verify Operation (S830)

Whether all the memory cells of the selected page have been programmed with a target threshold voltage or higher is determined by performing a program verify operation. If, as a result of the program verify operation, all the memory cells have been programmed with the target threshold voltage or higher, the program operation is determined to be a pass and the method ends. If one or more of the memory cells have threshold voltages lower than the target threshold voltage, the program operation is determined to be a fail.

4) Compare Program Voltage with First Program Set Voltage (S840)

The program voltage Vpgm used at step (S820) is compared with a first program set voltage VpgmX. According to an example, the first program set voltage VpgmX is higher than the start program voltage of the ISPP method. For example, the first program set voltage VpgmX may be set to 16 V.

5) Raise Program Voltage and Perform Program Operation (S850)

If, as a result of the comparison (S840), the program voltage Vpgm is equal to or lower than the first program set voltage VpgmX, the process returns to step S830 where the program voltage Vpgm is raised and the program operation is performed again. According to an example, the raised program voltage is higher than the previous program voltage per step voltage Vstep.

6) Compare Program Voltage with Second Program Set Voltage (S860)

If, as a result of the comparison (S840), the program voltage Vpgm is higher than the first program set voltage VpgmX, the program voltage Vpgm is compared with a second program set voltage VpgmY. According to an example, the second program set voltage VpgmY is lower than the last program voltage of the ISPP method. For example, the second program set voltage VpgmY may be set to 17.5 V. If, as a result of the comparison (S860), the program voltage Vpgm is higher than the second program set voltage VpgmY, the process returns to step S850 where the program voltage is raised and the program operation is performed again.

7) Set Bit Line Voltage Again (S870)

If, as a result of the comparison (S860), the program voltage Vpgm is equal to or lower than the second program set voltage VpgmY, a voltage of a bit line coupled to a failed memory cell is set to a new voltage higher than the ground voltage. According to an example, the new bit line voltage is higher than the previous bit line voltage per 'a x step voltage Vstep', but lower than the power source voltage supplied for program inhibition. Here, 'a' has a value between 0 and 1. A step voltage used to raise a program voltage in the ISPP method is used as the step voltage Vstep. Next, the process returns to step S830 where the program voltage Vpgm is raised and the program verify operation is performed again.

According to the fourth embodiment of this disclosure, if a program verify operation is determined to be a fail and a program voltage is between a first program set voltage and a second program set voltage, a bit line voltage is raised higher than a previous bit line voltage, and a programming method according to the ISPP method is performed. Accordingly, a threshold voltage rising per program pulse is reduced, and thus the width of a threshold voltage distribution is reduced as compared with the conventional art. In this embodiment, the width of a threshold voltage distribution is reduced because a step voltage is reduced in the ISPP method and the time taken to perform a program operation is not increased.

According to the embodiments of this disclosure, after a program voltage, the number of memory cells programmed with a target threshold voltage or higher is counted. If the number of counted memory cells is greater than a set number, the bit line voltage is raised so that the width of a threshold voltage distribution rising according to the program voltage is reduced. Accordingly, a threshold voltage distribution margin of a memory cell can be improved.

What is claimed is:

1. A programming method of a non-volatile memory device, comprising:
setting voltages of bit lines coupled to a memory cell block including a plurality of pages, wherein each page of the plurality of pages includes memory cells;
performing a program operation by supplying a program voltage to a word line coupled to a page selected from among the plurality of pages;
performing a program verify operation by supplying a program verify voltage to the word line coupled to the selected page and determining whether all of the memory cells of the selected page have been programmed with a target threshold voltage or higher;
counting a number of passed memory cells corresponding to a number of pass bits if, as a result of the program verify operation, the program operation failed to program all of the memory cells of the selected page to the target threshold voltage or higher;
making a pass bits determination that determines whether the number of pass bits is greater than a first number of pass permission bits; and
raising a voltage of a bit line coupled to a failed memory cell, if, as a result of the pass bits determination, the number of pass bits is greater than the first number of pass permission bits.

2. The programming method of claim 1, wherein setting voltages of bit lines comprises:
setting a voltage of a bit line coupled to a memory cell to be programmed, from among the bit lines, as a ground voltage, and
setting a voltage of a bit line coupled to a programmed-inhibited memory cell as a power source voltage.

3. The programming method of claim 1, wherein the first number of pass permission bits is set to 1% or lower of a total number of bits of the selected page.

4. The programming method of claim 1, wherein raising a voltage of a bit line coupled to a failed memory cell includes raising the set bit line voltage per a step voltage rising by a set constant.

5. The programming method of claim 4, wherein the set constant has a value between 0 and 1.

6. The programming method of claim 1, further comprising raising the program voltage per a step voltage and performing the program operation again if, as a result of the pass bits determination, the number of pass bits is equal to or less than the first number of pass permission bits.

7. The programming method of claim 1, further comprising raising the program voltage per a step voltage and performing the program operation again after raising the voltage of the bit line.

8. The programming method of claim 1, wherein if, as a result of the program verify operation, the program operation programmed all of the memory cells of the selected page with a target threshold voltage or higher, the program operation is finished.

9. The programming method of claim 1, further comprising:
   making a second pass bits determination that determines whether the number of pass bits is greater than a second number of pass permission bits before raising a voltage of a bit line coupled to a failed memory cell; and
   if, as a result of the second pass bits determination, the number of pass bits is greater than the second number of pass permission bits, raising the voltage of the bit line coupled to the failed memory cell.

10. The programming method of claim 9, further comprising raising the program voltage per a step voltage and performing the program operation again if, as a result of the determination, the number of pass bits is equal to or less than the second number of pass permission bits.

11. The programming method of claim 9, wherein the second number of pass permission bits is set to 99% or higher of a total number of bits of the selected page.

12. A programming method of a non-volatile memory device, comprising:
   setting voltages of bit lines coupled to a memory cell block including a plurality of pages, wherein each page of the plurality of pages includes memory cells;
   performing a program operation by supplying a program voltage to a word line coupled to a page selected from among the plurality of pages;
   performing first to third program verify operations by sequentially supplying first to third program verify voltages to the word line coupled to the selected page and determining whether all of the memory cells of the selected page have been programmed with a first to third target threshold voltage or higher;
   if, as a result of the first program verify operation, the program operation failed to program all of the memory cells of the selected page to the first target threshold voltage or higher, making a first pass bits determination that determines whether a number of first pass bits corresponding to a number of counted passed memory cells is greater than a first number of pass permission bits;
   if, as a result of the first pass bits determination, the number of first pass bits is greater than the first number of pass permission bits, making a second pass bits determination that determines whether the number of first pass bits is greater than a second number of pass permission bits; and
   if, as a result of the second pass bits determination, the number of first pass bits is equal to or less than the second number of pass permission bits, raising the voltage of the bit line, coupled to a failed memory cell, to a first bit line voltage.

13. The programming method of claim 12, wherein setting voltages of bit lines comprises:
   setting a voltage of a bit line coupled to a memory cell to be programmed, from among the bit lines, as a ground voltage, and
   setting a voltage of a bit line coupled to a programmed-inhibited memory cell as a power source voltage.

14. The programming method of claim 12, wherein performing first to third program verify operations comprises:
   performing the second program verify operation, if, as a result of the first program verify operation, the program operation programmed all of the memory cells of the selected page to the first target threshold voltage or higher, and
   performing the third program verify operation, if, as a result of the second program verify operation, the program operation programmed all of the memory cells of the selected page to a second target threshold voltage or higher.

15. The programming method of claim 14, wherein if, as a result of the second program verify operation, the program operation failed to program all of the memory cells of the selected page to the second target threshold voltage or higher, when a number of second pass bits corresponding to a number of passed memory cells is greater than the first number of pass permission bits and the number of second pass bits is equal to or less than the number of second pass bits, the voltage of the bit line coupled to the failed memory cell is raised to a second bit line voltage.

16. The programming method of claim 14, wherein if, as a result of the third program verify operation, the program operation failed to program all of the memory cells of the selected page to a third target threshold voltage or higher, when a number of third pass bits corresponding to a number of passed memory cells is greater than the first number of pass permission bits and the number of third pass bits is equal to or less than the number of second pass bits, the voltage of the bit line coupled to the failed memory cell is raised to a third bit line voltage.

17. The programming method of claim 12, wherein raising a voltage of a bit line coupled to a failed memory cell includes raising the set bit line voltage per a step voltage rising by a set constant.

18. The programming method of claim 17, wherein the set constant has a value between 0 and 1.

19. The programming method of claim 12, wherein if, as a result of the first pass bits determination, the first number of pass bits is equal to or less than the first number of pass permission bits, performing second program verify operation.

20. The programming method of claim 12, wherein if, as a result of the second pass bits determination, the first number of pass bits is greater than the second number of pass permission bits, performing third program verify operation.

21. The programming method of claim 12, further comprising raising the program voltage per a step voltage and performing the program operation again, after raising the voltage of the bit line.

22. A programming method of a non-volatile memory device, comprising:
   setting voltages of bit lines coupled to a memory cell block including a plurality of pages, wherein each page of the plurality of pages includes memory cells;
   performing a program operation by supplying a program voltage to a word line coupled to a page selected from among the plurality of pages;
   performing a program verify operation by supplying a program verify voltage to the word line coupled to the selected page and determining whether all of the memory cells of the selected page have been programmed with a first to third target threshold voltage or higher;
   if, as a result of the program verify operation, the program operation failed to program all of the memory cells of the selected page to the first target threshold voltage or higher, making a first determination that determines whether the program voltage is between a first program set voltage and a second program set voltage; and if, as a result of the first determination, the program voltage is between the first program set voltage and the second program set voltage, raising a voltage of a bit line coupled to a failed memory cell.

23. The programming method of claim 22, further comprising raising the program voltage per a step voltage and performing the program operation again, if the program voltage is equal to or lower than the first program set voltage.

24. The programming method of claim 22, further comprising raising the program voltage per a step voltage and performing the program operation again, if the program voltage is higher than the first program set voltage.

25. The programming method of claim 22, wherein raising a voltage of a bit line coupled to a failed memory cell includes raising the set bit line voltage per a step voltage rising by a set constant.

26. The programming method of claim 25, wherein the set constant has a value between 0 and 1.

27. The programming method of claim 22, wherein:
the first program set voltage is higher than a start program voltage of an incremental step pulse programming (ISPP) method, and
the second program set voltage is lower than a last program voltage of the ISPP method.

28. The programming method of claim 22, further comprising raising the program voltage per a step voltage and performing the program operation again, after raising the voltage of the bit line.

\* \* \* \* \*